(12) United States Patent
Gracias et al.

(10) Patent No.: US 7,268,075 B2
(45) Date of Patent: Sep. 11, 2007

(54) METHOD TO REDUCE THE COPPER LINE ROUGHNESS FOR INCREASED ELECTRICAL CONDUCTIVITY OF NARROW INTERCONNECTS (<100NM)

(75) Inventors: David H. Gracias, Portland, OR (US); Chih-I Wu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 138 days.

(21) Appl. No.: 10/439,975

(22) Filed: May 16, 2003

(65) Prior Publication Data
US 2004/0229462 A1    Nov. 18, 2004

(51) Int. Cl.
*H01L 21/445*   (2006.01)
(52) U.S. Cl. .......... 438/656; 438/675; 438/699
(58) Field of Classification Search ......... 438/652, 438/653, 685, 687, 694, 697, 699, 703, 656, 438/674, 675
See application file for complete search history.

(56) References Cited

U.S. PATENT DOCUMENTS

| | | | |
|---|---|---|---|
| 6,297,157 B1* | 10/2001 | Lopatin et al. | 438/687 |
| 6,303,014 B1* | 10/2001 | Taylor et al. | 205/103 |
| 6,689,686 B2* | 2/2004 | Guldi et al. | 438/678 |
| 6,736,953 B1* | 5/2004 | Zhu et al. | 205/103 |
| 6,784,096 B2* | 8/2004 | Chen et al. | 438/637 |
| 6,815,336 B1* | 11/2004 | Shue et al. | 438/626 |
| 2002/0074234 A1* | 6/2002 | Dubin et al. | 205/182 |

OTHER PUBLICATIONS

Feynman, Richard P., et al., The Feynman Lectures On Physics, Mainly Electromagetism And Matter, vol. II, © 1964, California Institute Of Technology, Sixth printing, Feb. 1977, pp. 6-13 and 6-14, Addison-Wesley Publishing Company, Reading, Massachusetts, Menlo Park, California, London, Amsterdam, Don Mills, Ontario, Sydney.
Steinhögl, W., et al., Surface and Grain Boundary Scattering: A Modelling Study on Effects Dominating the Electrical Resistivity in sub-50nm Copper Lines, Advanced Metallization Conference (AMC) 2002, San Diego, Oct. 2002, 2 pages.

* cited by examiner

*Primary Examiner*—Stephen W. Smoot
(74) *Attorney, Agent, or Firm*—Blakely, Sokoloff, Taylor & Zafman LLP

(57) ABSTRACT

Embodiments of the present invention provide methods to reduce the copper line roughness for increased electrical conductivity in narrow interconnects having a width of less than 100 nm. These methods reduce the copper line roughness by first smoothing the surface on which the copper lines are formed by performing a short electrochemical etch of the surface. The electrical conductivity of the interconnects is increased by reducing the copper line roughness that in turn reduces the resistivity of the copper lines.

7 Claims, 11 Drawing Sheets

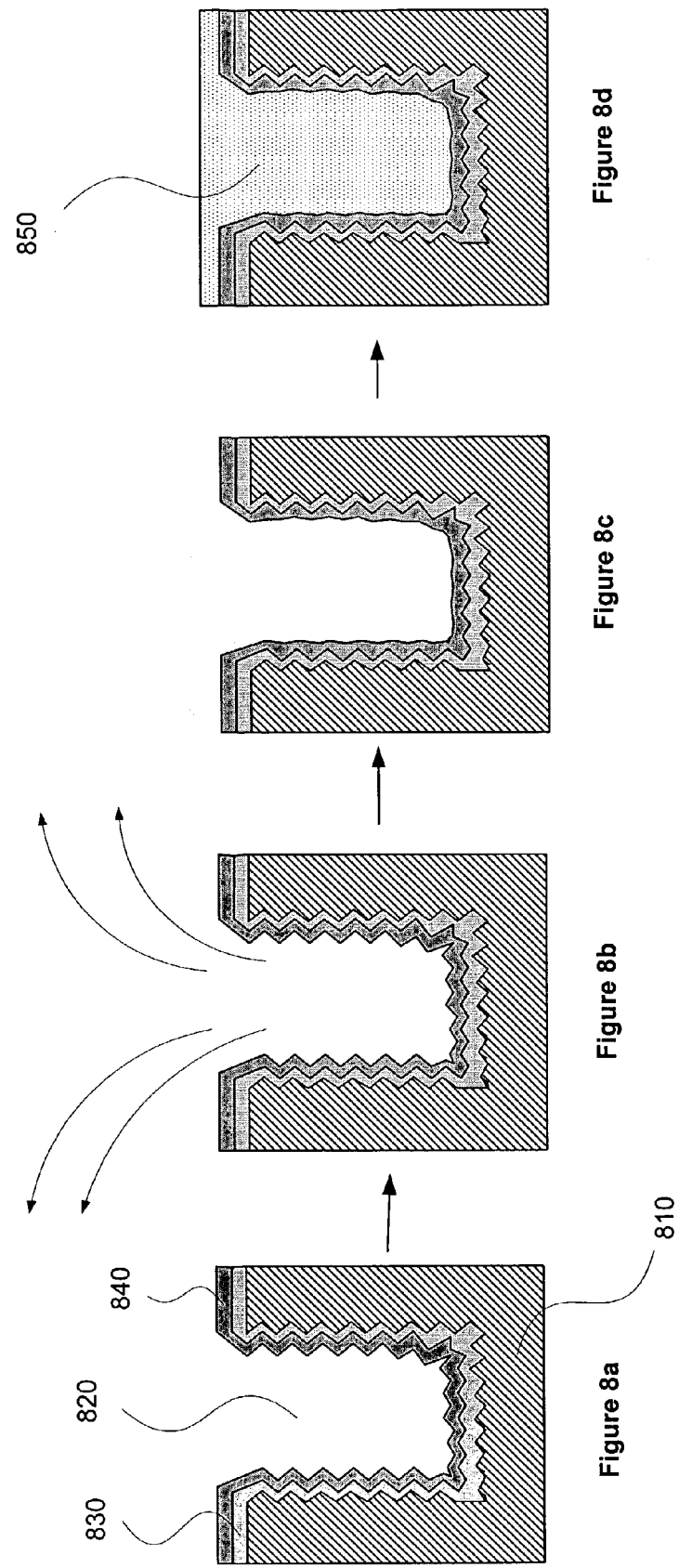

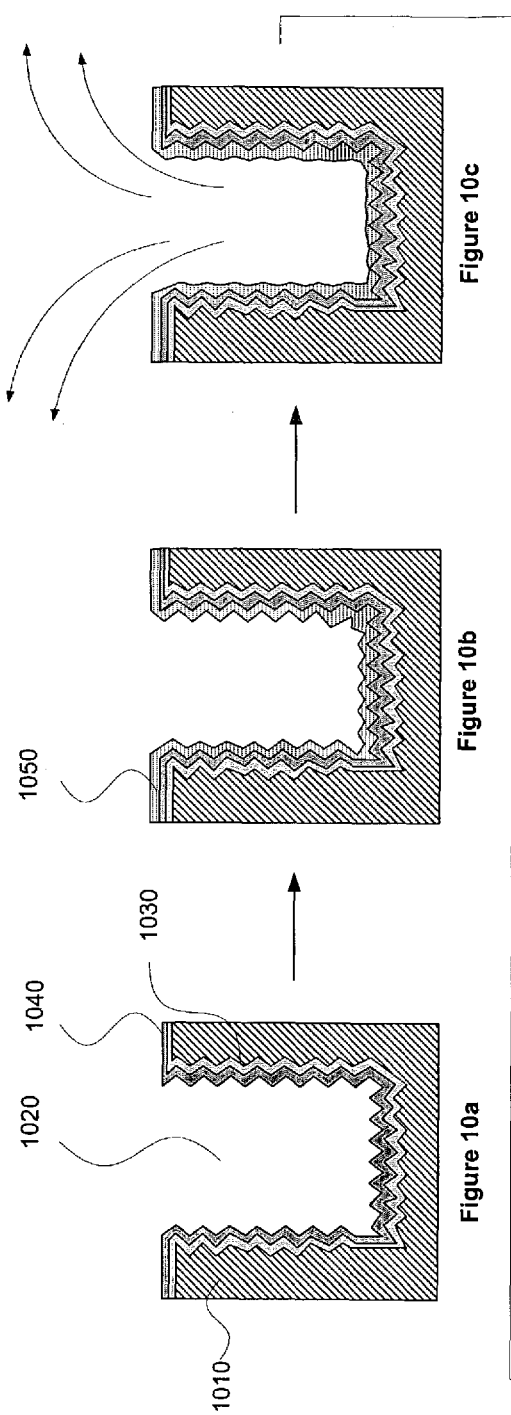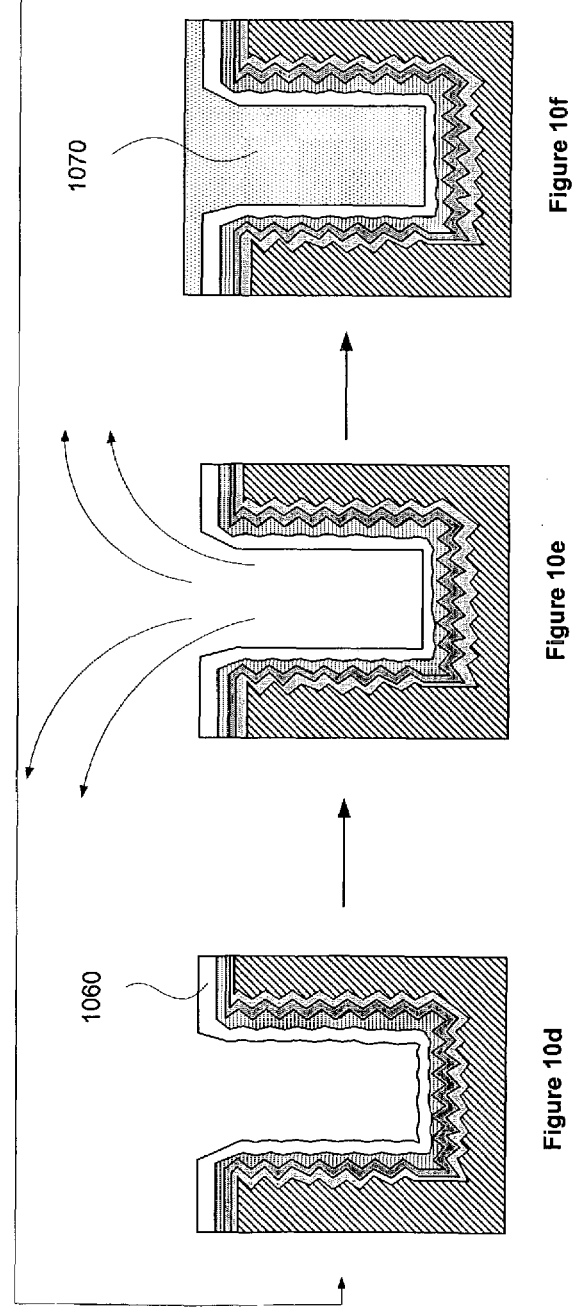

METHOD TO REDUCE THE COPPER LINE ROUGHNESS FOR INCREASED ELECTRICAL CONDUCTIVITY OF NARROW INTERCONNECTS (<100NM)

FIELD OF THE INVENTION

Embodiments of the present invention relate to the field of semiconductor devices and fabrication and more particularly to the reduction of resistance in narrow copper interconnect structures.

BACKGROUND

Advances in semiconductor manufacturing technology have led to the development of integrated circuits having multiple levels of interconnect. In such an integrated circuit, patterned conductive material on one interconnect level is electrically insulated from patterned conductive material on another interconnect level by films of material such as, for example, silicon dioxide. These conductive materials are typically a metal or metal alloy. Connections between the conductive material at the various interconnect levels are made by forming openings in the insulating layers and providing an electrically conductive structure such that the patterned conductive material from different interconnect levels are brought into electrical contact with each other. These electrically conductive structures are often referred to as contacts or vias.

Other advances in semiconductor manufacturing technology have lead to the integration of millions of transistors, each capable of switching at high speed. A consequence of incorporating so many fast switching transistors into an integrated circuit is an increase in power consumption during operation. One technique for increasing speed while reducing power consumption is to replace the traditional aluminum and aluminum alloy interconnects found on integrated circuits with a metal such as copper, which offers lower electrical resistance. Those skilled in the electrical arts will appreciate that by reducing resistance, electrical signals may propagate more quickly through the interconnect pathways on an integrated circuit. Furthermore, because the resistance of copper is significantly less than that of aluminum, the cross-sectional area of a copper interconnect line, as compared to an aluminum interconnect line, may be made smaller without incurring increased signal propagation delays based on the resistance of the interconnect.

But, the resistance of the copper interconnects will become significant once the width of the interconnects is less than around 100 nm. It is estimated that within the next five to ten years the minimum feature size will continue to shrink to below 45 nm. One approach to decreasing the resistance of copper lines having a width of less than 100 nm has been to anneal the copper to improve the conductive properties of the interconnect lines. But this has not been found sufficient. Embodiments of the current invention provide methods of reducing the resistivity of copper lines having a width of less than 100 nm, and in particular below 50 nm.

BRIEF DESCRIPTION OF THE DRAWINGS

FIG. 8a-d are illustrations of a cut away side view of an interconnect structure on which the copper seed layer is electrochemically etched.

FIG. 10a-f is an illustration of a cut away side view of an interconnect structure on which a first thin copper layer is deposited and etched and a second thin copper layer is also deposited and etched to form a smooth surface within a trench.

DETAILED DESCRIPTION

Methods of reducing the resistivity of copper lines having a width of less than 100 nm are described. In the following description numerous specific details are set forth to provide an understanding of the embodiments of the present invention. It will be apparent, however, to those skilled in the art and having the benefit of this disclosure, that the embodiments of the present invention may be practiced with materials and processes that vary from those specified here.

Embodiments of the present invention provide methods to reduce the copper line roughness in order to increase electrical conductivity in narrow interconnects having a width of less than 100 nm. These methods reduce the copper line roughness by smoothing the surface on which the copper lines are formed. The copper lines are smoothed by performing a short electrochemical etch of the surface over which the copper line is formed. The electrical conductivity of the interconnects is increased because the copper line roughness that causes the resistivity of the copper lines is reduced.

The resistance of copper interconnect lines increases significantly once the line width of the copper lines is less than 100 nm and increases dramatically once the width of those lines is reduced to around 50 nm. This is because the mean free path of an electron in copper is also around 50 nm. The mean free path of an electron is how far an electron will travel before hitting something, such as a copper atom or an edge of the copper interconnect. Therefore, once the width of the copper interconnect approaches the mean free path of an electron in copper, the resistance of the copper interconnect increases dramatically because electrons are more likely to hit the edges of the interconnect. When electrons hit the edges of the interconnect it is called surface scattering, a particular type of resistance. The term surface scattering refers to a type of resistance that is created when the electrons of an electrical current bump into the walls of an interconnect line as they flow through it. Specifically, surface scattering is when an electron bounces off of a wall at an angle and then continues to repel off of the walls. Surface scattering typically occurs once the width of the interconnect line is equal to or less than the mean free path of an electron for the specific type of material of which the interconnect line is made.

Figure 1:
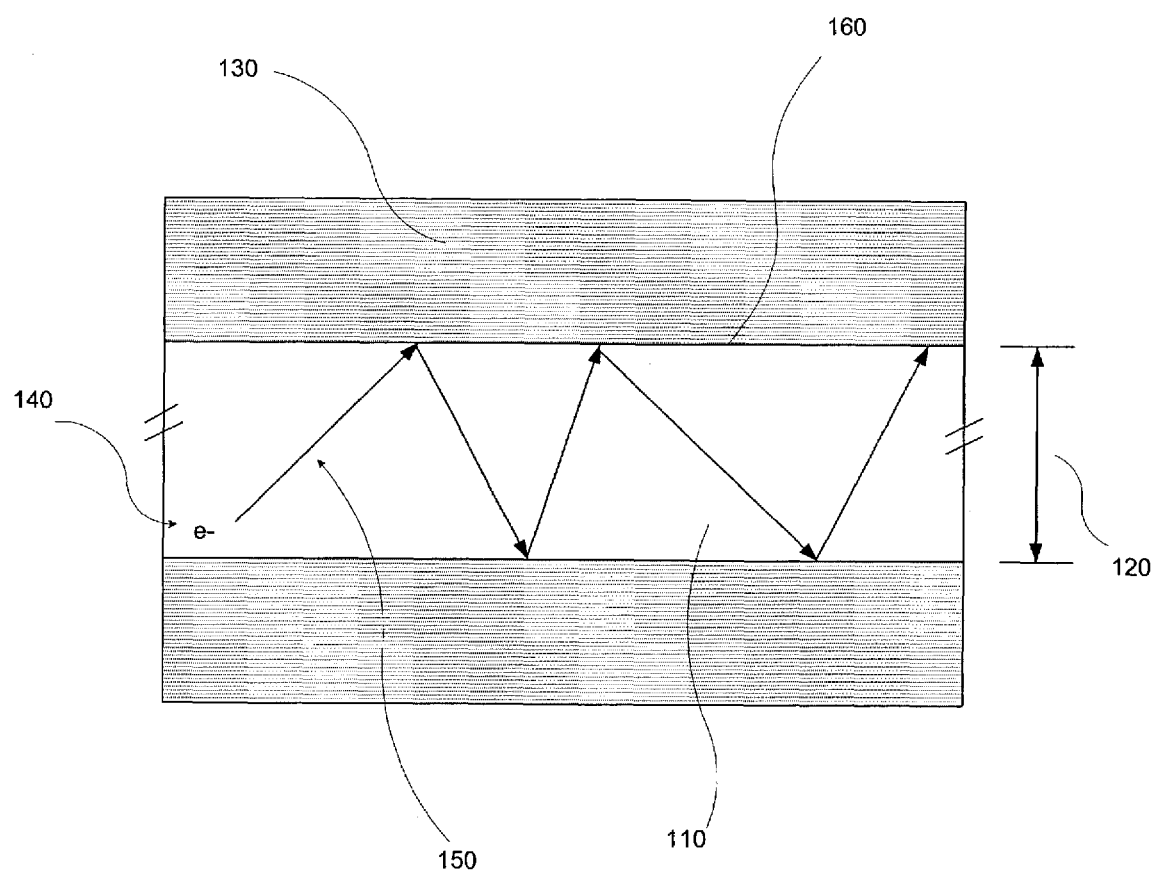
FIG. 1 is an illustration of a top view of an interconnect line illustrating surface scattering.

Surface scattering is illustrated in FIG. 1. FIG. 1 illustrates a top view of a copper interconnect line 110 having a width 120 of less than around 100 nm within a dielectric 130. The path of an electron 140 is illustrated by the arrows 150. The arrows 150 illustrate the surface scattering of the electron 140. This electron will bounce off of the walls of the interconnect line at an angle and continue repelling off of the walls, creating resistance. The electrons may also bounce off of the top and the bottom of the interconnect line. Surface scattering will be exacerbated if the walls of the trench are rough because there are more points to "snag" the electron, effectively narrowing the width of the trench even more.

Figure 2:
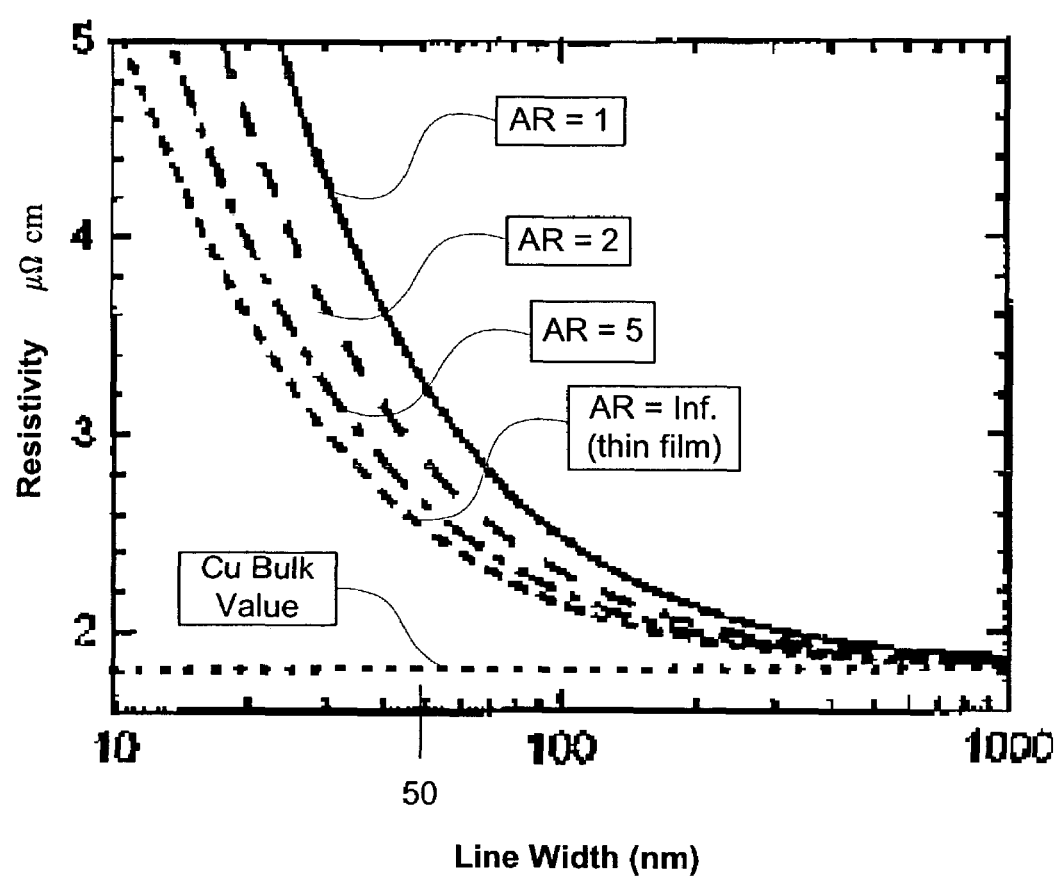
FIG. 2 is a graph depicting the resistivity of copper interconnect lines having various aspect ratios (AR) as a function of line width.

The graph of FIG. 2 illustrates the surface scattering contribution to the resistivity of thin copper wires with different aspect ratios. The graph is from the paper "Surface and Grain Boundary Scattering: A modeling study on effects dominating the electrical resistivity in sub-50 nm copper lines, Advanced Metallization conference, 2002" by M. Engelhardt et al. The figure plots the surface scattering contribution to the resistivity of thin copper wires as a function of line width as given by the equation of Fuchs and Sondheimer (E. H. Sondheimer, Adv. Phys. 1,1 (1952)). In creating the graph, 100% diffuse scattering and a temperature of 300 K was assumed. The resistivity ($\mu\Omega$/cm) is charted on the Y axis and the Line width (nm) is charted on the X axis. For all of the aspect ratios (AR) graphed (AR=1, 2, 5, and thin film) the resistivity starts to increase significantly at around 100 nm and then increases dramatically at a line width of around 50 nm. The resistivity of the copper lines increases from approximately 2 $\mu\Omega$/cm for the copper bulk value to approximately 2.5 $\mu\Omega$/cm for 100 nm width lines and to approximately 3.5 $\mu\Omega$/cm for 50 nm line widths. This graph makes it clear that in the future generation of interconnect structures having line widths of less than 100 nm, and in particular less than 50 nm, the surface scattering contribution to the resistance of the interconnect lines will become significant.

Figure 3A:
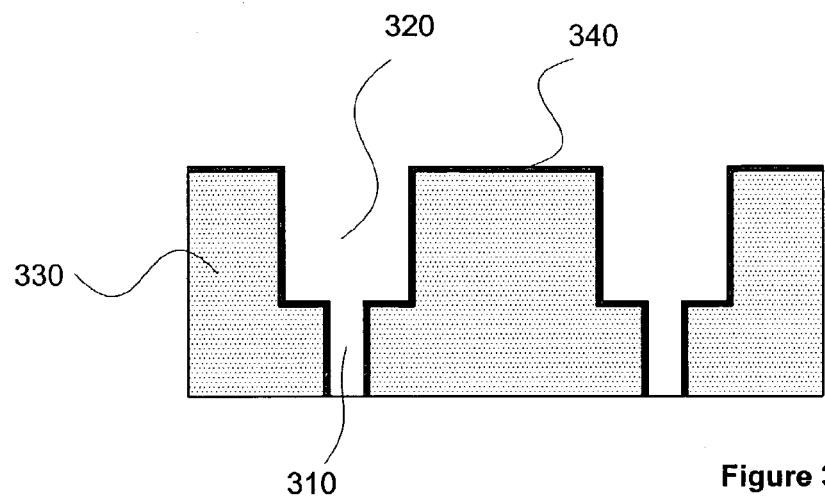
FIGS. 3a-c are illustrations of a cross-sectional view of a conventional dual damascene process used to form an interconnect structure.
Figure 3B:
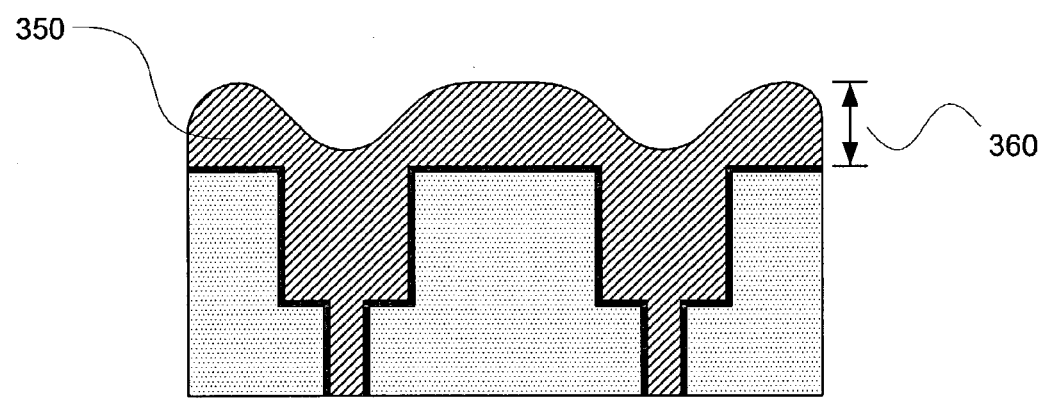
Figure 3C:
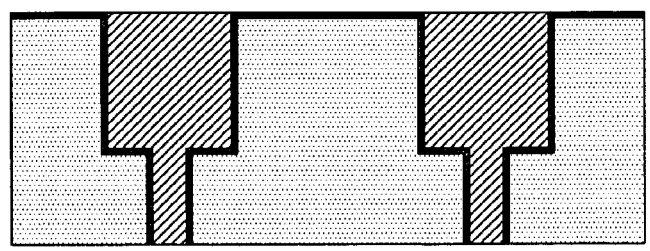

Embodiments of the present invention provide methods of reducing the line roughness of interconnect lines to reduce the resistivity caused by surface scattering that is exacerbated by line roughness. In a preferred embodiment the methods apply to copper lines having a width of less than 100 nm. Copper interconnect lines formed by the conventional damascene process have considerable roughness along their walls within a trench due to the porosity of low dielectric constant (k) dielectric materials. Copper interconnect lines are formed by way of a damascene, or inlaid, metal process. Typically the well-known dual damascene technique is used to form both copper vias and trenches in a single layer. FIG. 3a illustrates a dual damascene structure after vias 310 and trenches 320 have already been etched into dielectric layer 330. A barrier layer 340 can optionally be formed over the patterned dielectric layer 330. The barrier layer 340 is illustrated after it has been etched from the bottom of the vias 310. The barrier layer can be Ta, TaN, TaSiN, W, WN, WSiN, Ti, TiN, TiSiN, and other alloys and composites of these materials. FIG. 3b illustrates the dual damascene structure after the vias 310 and trenches 320 have been filled with copper 350. The excess copper layer 360 is then polished using chemical mechanical polishing (CMP), resulting in the planarized dual damascene structure illustrated in FIG. 3c.

Figure 4:
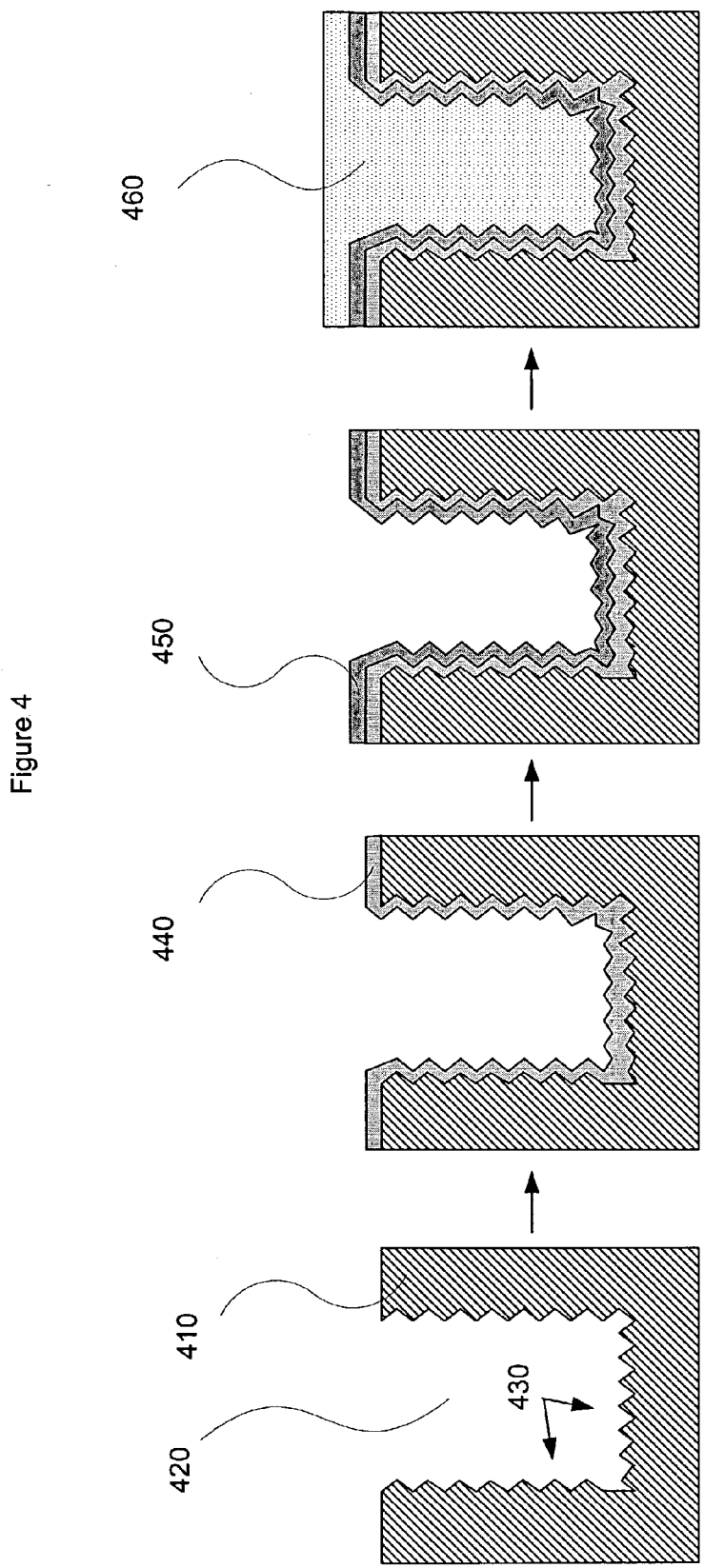
FIG. 4 is an illustration of a cross-sectional view of an interconnect structure having roughness within a trench.

The roughness of the copper interconnect lines is illustrated in FIG. 4. For the sake of simplicity, FIG. 4 illustrates a dielectric 410 into which only a trench 420 has been formed. The dielectric 410 typically has a low dielectric constant of less than around 3.2. Dielectric materials such as carbon doped oxide (CDO), SiOF, organic dielectrics, and organic polymers may be used. These low dielectric constant materials tend to have high porosity, so that when a trench 420 is formed, the walls 430 of the trench will be rough. Over this rough dielectric surface a barrier layer 440 having a thickness of between 2-10 nm is typically formed by sputtering, physical vapor deposition (PVD) that is often with a self-ionized plasma, or atomic layer deposition (ALD). The barrier layer can be Ta, TaN, TaSiN, W, WN, WSiN, Ti, TiN, TiSiN, and other alloys and composites of these materials. A barrier layer can be used to prevent the copper diffusion of copper atoms from within the trench. As can be seen in FIG. 4, the barrier layer 440 is conformal to the roughness of the dielectric layer within the trench, meaning that the barrier layer will also be rough. Over the barrier layer a seed layer 450 having a thickness of between 20-40 nm is typically formed. The seed layer is formed by sputtering or PVD (physical vapor deposition) in the same chamber where the barrier layer is formed. A seed layer is often used as a seed for the bulk deposition of the copper that is used to fill the trench. The seed layer 450 is also conformal to the roughness of the barrier layer. Because the roughness of the dielectric layer is translated into each of the successive layers placed over it, the copper interconnect line 460 will as a result have rough walls within the trench. The walls will be rough enough to contribute to an increase in the surface scattering and thus the resistivity of the interconnect line. By reducing this roughness, the surface scattering and resistivity can also be reduced. In turn, the overall performance of interconnect devices can be improved. The advantages of lowering the resistivity include lower power requirements, less heating, and less noise.

The bulk copper layer that forms the interconnect line is typically electrochemically deposited. The bulk copper layer as well as any conductive layer to which an electrode can be attached (such as a thick barrier or seed layer) can also be electrochemically etched. The terms electrochemical, electrolytic, and electrolyte solution all refer to a chemical solution to which an electrical current is applied to produce ions. The production of ions by the electrical current may be used to electrochemically deposit a thin film of material onto a surface or to electrochemically etch a thin film of material from a surface.

Figure 5:
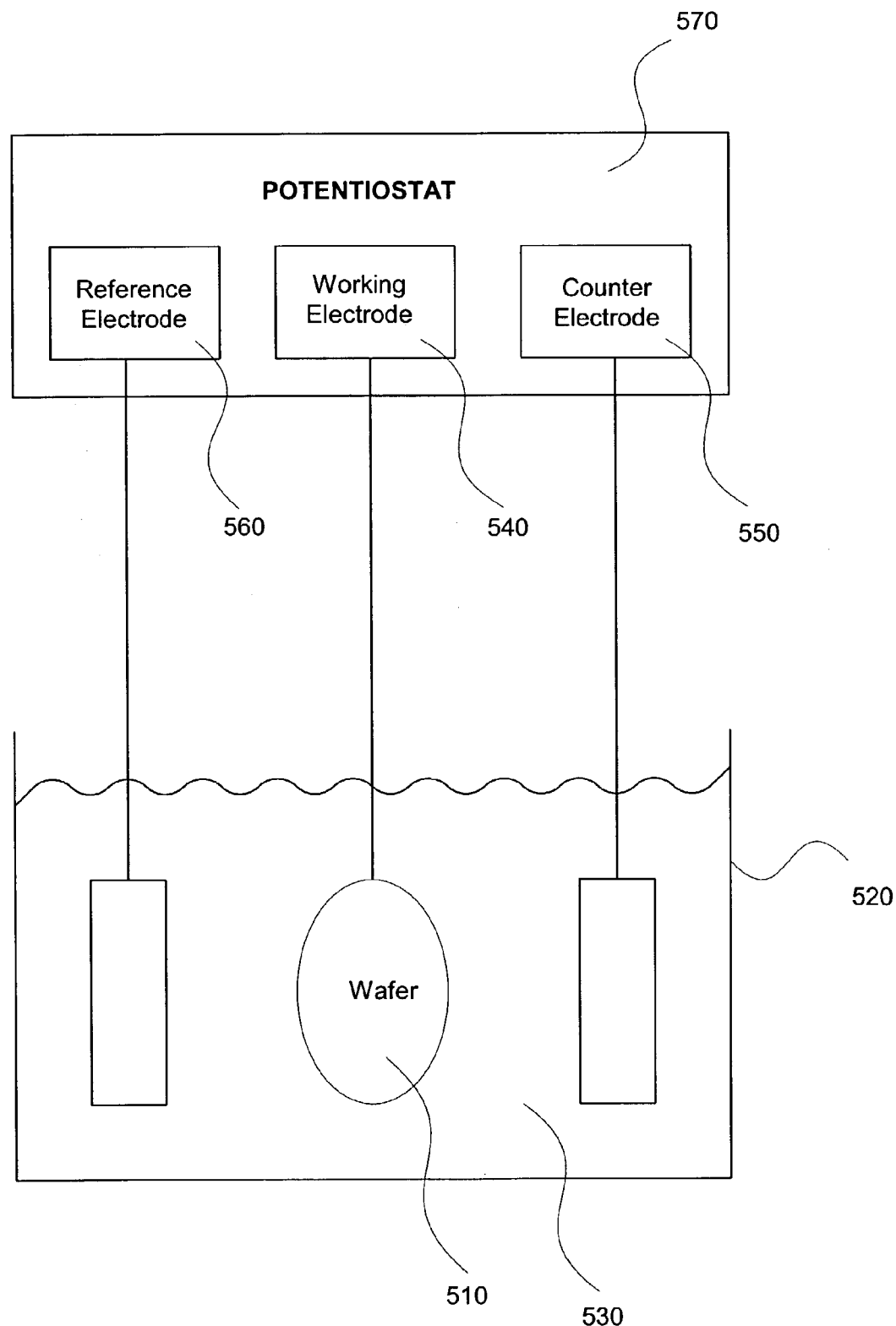
FIG. 5 is an illustration of a general schematic for an electrolytic tool used to electrochemically deposit or etch a surface.

A general schematic for an electrolytic tool for the electrochemical deposition or etching of these layers is illustrated in FIG. 5. A wafer 510 on which the interconnect structures are formed is immersed in an electrolytic bath 520 containing an electrolyte solution 530. The wafer is connected to a working electrode 540 by a conductive layer (such as a barrier layer or a copper seed layer) so that it can be electrically charged to act as an anode or a cathode in an electrochemical process. A counter electrode 550 is also immersed in the electrolyte solution 530. Additionally, a reference electrode 560 is immersed in the electrolyte solution so that the potentiostat 570, to which all of the electrodes are connected, can adjust the voltage of the working electrode 540 to the proper value for deposition or etching of the layers on the interconnect structure. The voltage is a function of the physical properties of the material that is to be deposited or etched.

Figure 6A:
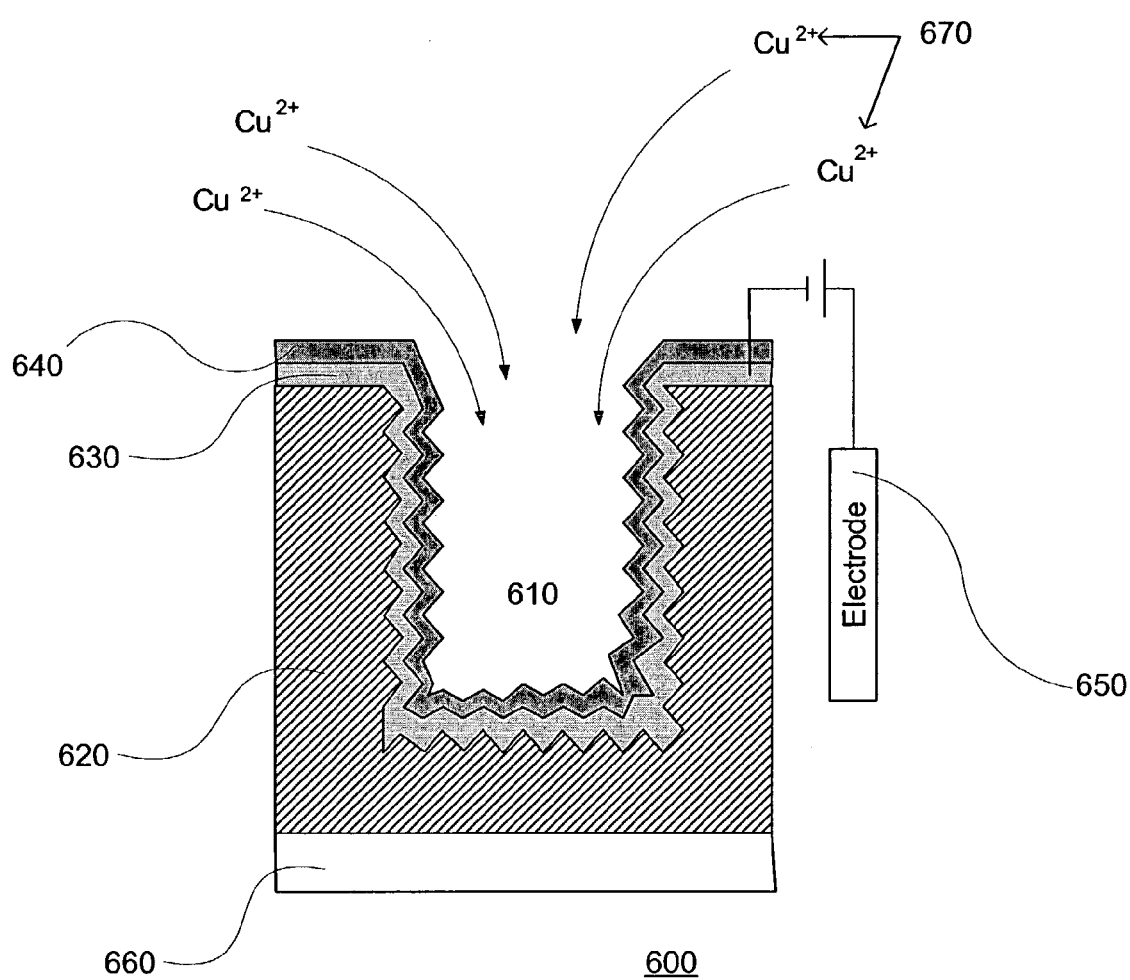
FIG. 6a is an illustration of the electrochemical deposition of copper onto an interconnect structure.

FIG. 6a illustrates an embodiment of an electrochemical deposition process performed to form a copper layer 640 over a copper seed layer 630 within a trench 610 on an interconnect structure 600. An electrode 650 is coupled to a conductive layer on the interconnect structure 600 on a wafer 660. The electrode can be coupled to the seed layer 630 or to a conductive barrier layer that is formed over the ILD within the trench. In an electrochemical deposition process for copper the electrode coupled to the interconnect structure 600 has a negative electrical charge (to serve as the cathode). A counter electrode (not shown) has a positive electrical charge (to serve as the anode). The interconnect structure 600 is immersed in an electrolyte solution (not shown) containing copper cations ($Cu^{2+}$) 670 that are typically provided by copper sulfate. The copper cations ($Cu^{2+}$) will be attracted to the negatively charged seed layer 630 and will thus deposit on it, as expressed by the equation: $Cu^{2+}$ (solution)+$2e^-$=Cu (wafer). An equivalent amount of copper cations will dissolve into the electrolyte solution from the counter electrode to maintain the flow of copper cations onto the seed layer surface. By this electrochemical process any conductive layer may be deposited.

Figure 6B:
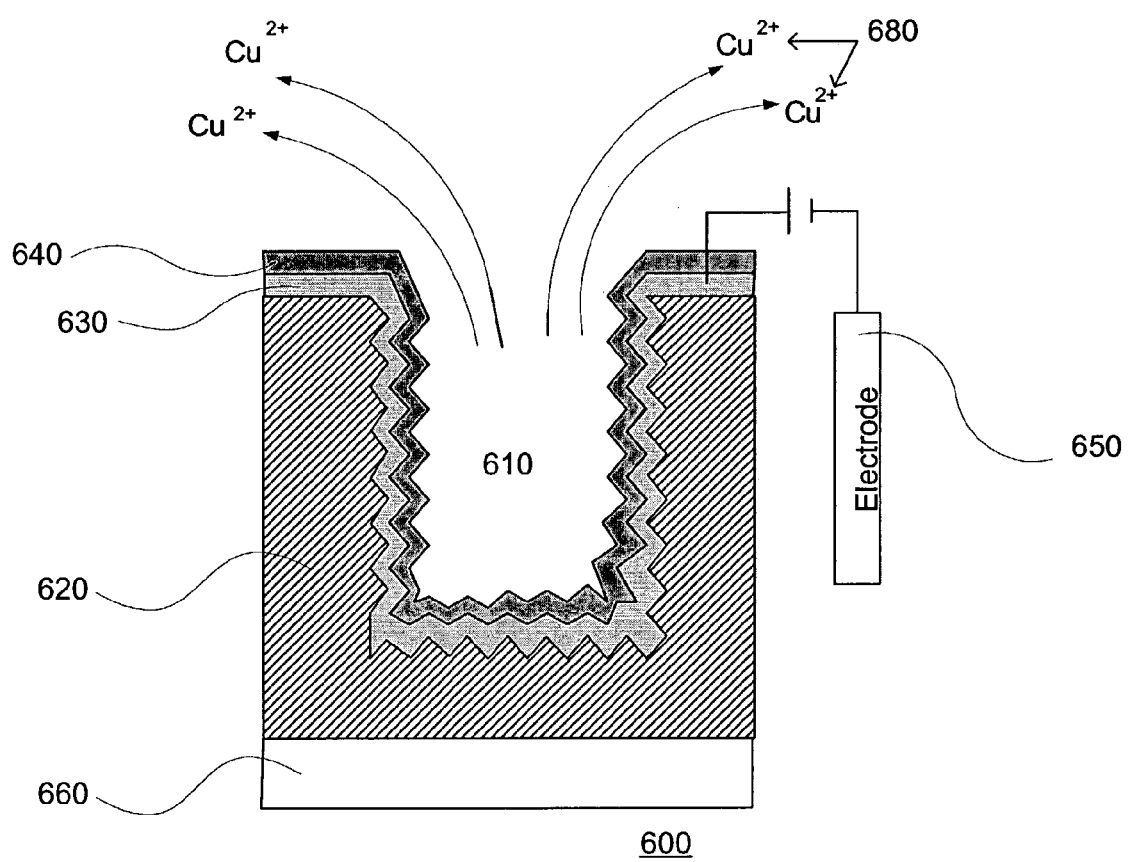
FIG. 6b is an illustration of the electrochemical etching of copper from a copper seed layer on an interconnect structure.

FIG. 6b illustrates an electrochemical etching process performed on the interconnect structure 600. In an electrochemical etching process the electrical charge of the electrode is reversed so that the interconnect structure 600 on the wafer 660 has a positive charge (becoming the anode) and the counterelectrode has a negative charge (becoming the cathode). Copper cations 680 will be removed from the seed layer by their attraction to the negatively charged counterelectrode. The copper cations ($Cu^{2+}$) will go into the electrolyte solution, as expressed by the equation: Cu(wafer)−$2e^-$=$Cu^{2+}$ (solution). By this electrochemical process the copper seed layer, or any conductive layer desired, may be etched.

Figure 7:
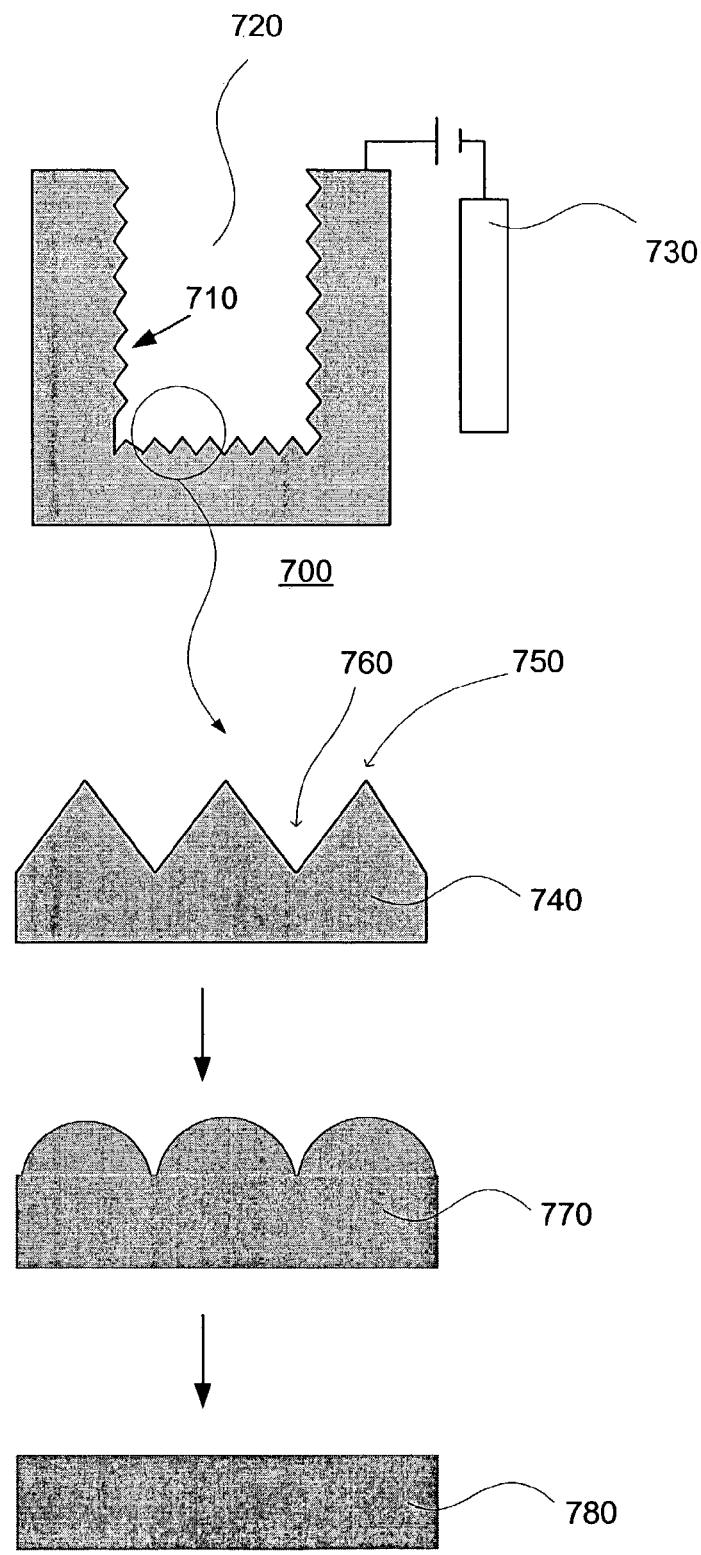
FIG. 7 is an illustration of the smoothing of a rough surface by an electrochemical etch.

An electrochemical etch will smooth a rough surface based on the difference between the electrical field at the sharp portions of a rough surface and the electrical field at the shallow portions of a rough surface. FIG. 7 illustrates an interconnect structure 700 having a conductive rough surface 710 within trench 720 to which an electrode 730 is coupled. An enlargement of the rough surface 710 is illustrated as 740. The rough surface has sharp portions 750 and shallow portions 760. When an electrical voltage is applied to a rough surface the electrical field at the sharp portions 750 is much higher than the electrical field at the shallow portions 760. The field differences between the sharp portions and the shallow portions can be as great as $10^6$. Because the field is so high at the sharp portions, material is removed at a faster rate from the sharp portions than it is from the shallow portions so that the sharp portions are blunted, as illustrated by the surface 770. Thereby the rough surface is smoothed until the field is constant everywhere and the surface is smooth as illustrated by the surface 780. This is why even a slight etch of a conductive layer, such as a seed layer, will have a considerable effect on reducing the roughness of the interconnect lines. The roughness of the interconnect lines will be reduced because the electrodeposition of the lines will begin on a smooth surface resulting in less defects and line roughness.

In a preferred embodiment of the current invention the roughness of the interconnect lines is reduced or eliminated by smoothing the copper seed layer with an electrochemical etch. This process is illustrated in FIGS. 8a-d. FIG. 8a illustrates a dielectric layer 810 into which a trench 820 has been formed. A barrier layer 830 having a thickness of 2-10 nm, that is typically tantalum or tantalum nitride, is formed over the trench 820 by sputtering, PVD, or ALD and a copper seed layer 840 having a thickness of between about 20-40 nm is also deposited by sputtering or PVD within the same chamber as the barrier layer. The seed layer is typically copper, but it may also be any conductive material such as copper aluminum alloy or a refractory metal such as tungsten or tantalum. After forming the barrier and seed layers the structures is placed into an electroplating bath and the electrode clamped on the seed layer. The copper seed layer is then electrochemically etched at FIG. 8b as described above to form a smooth surface as illustrated at FIG. 8c. The copper seed layer is etched from a rough surface that causes significant resistance and surface scattering to a surface that minimizes the effects of resistance and surface scattering in copper lines of less than 100 nm in width. A bulk copper layer 850 is then deposited over the smooth seed layer to fill the trench, as illustrated at FIG. 8d.

A smooth copper seed layer will improve the nucleation of the copper deposited to fill the trench and therefore create a smooth copper grain boundary between the seed layer 840 and the copper layer 850. A grain boundary is a change in the crystalline structure. Providing a consistent and smooth grain boundary will reduce the resistivity of a copper line. In a preferred embodiment, the copper layer 850 is deposited electrochemically onto the smooth copper seed layer after reversing the polarity of the electrode coupled to the interconnect structure after the electrochemical etching. The etching of the copper seed layer and the deposition of the copper layer can both be performed in the same tool and using the same electrolytic solution, making the process more efficient and easy to implement. This has the added benefit of low cost because no additional tools are needed.

In an alternate embodiment, after the copper seed layer has been electrochemically etched, a second thin copper seed layer is formed over the first smoothed seed layer by electrochemical deposition. This second thin copper seed layer is then etched electrochemically to form an even smoother copper seed layer surface on which the bulk copper layer is deposited. The deposition and etch of the second thin copper seed layer can also be performed in the same electrochemical tool as the deposition and etch of the first copper seed layer. After the first copper seed layer is etched, the polarity of the electrode is simply reversed to deposit the second thin copper seed layer, reversed again to etch the second thin copper seed layer, and reversed yet again to deposit the bulk copper layer.

Figure 9A:
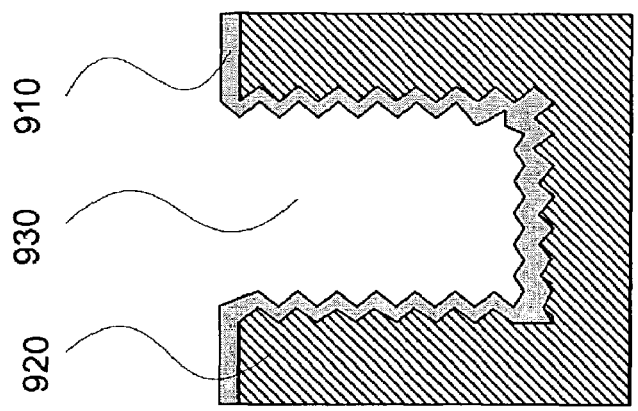
FIG. 9a-c are illustrations of a cut away side view of an interconnect structure on which the barrier layer is electrochemically etched.
Figure 9B:
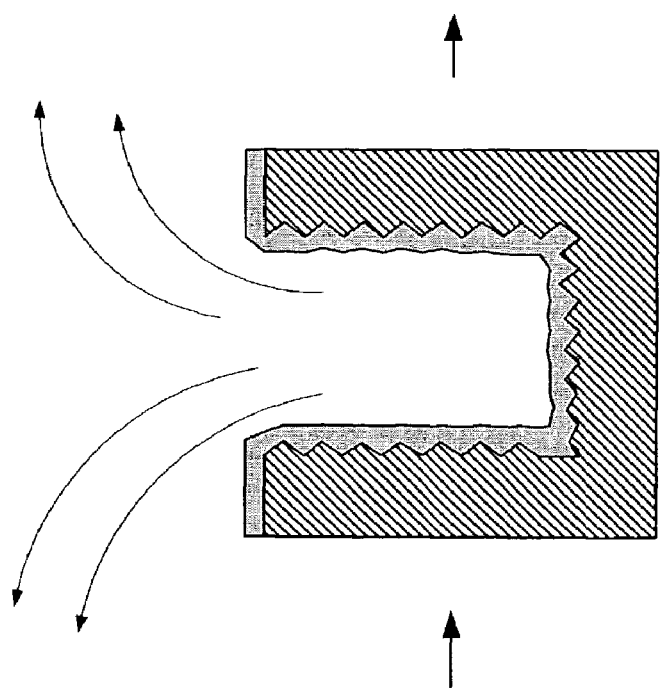
Figure 9C:
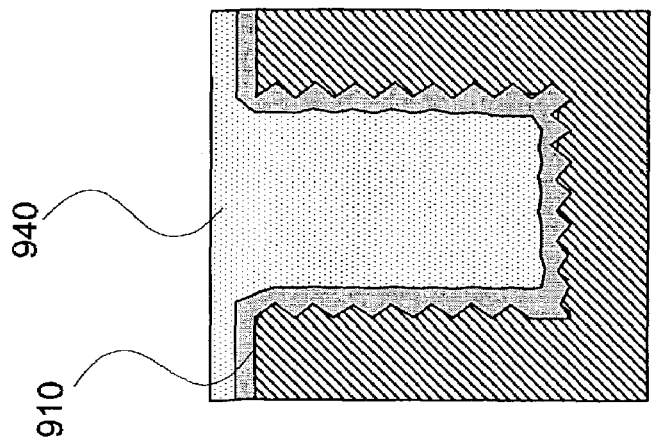

In an alternate embodiment, the roughness of the interconnect line is reduced by smoothing a conductive barrier layer. This process is illustrated in FIGS. 9a-9c. A thick barrier layer 910, having a thickness of greater than 20 mm, is formed by sputtering, PVD, or ALD over a dielectric layer 920 having a trench 930, as illustrated at FIG. 9a. The barrier layer can be Ta, TaN, TaSiN, W, WN, WSiN, Ti, TiN, TiSiN, and other alloys and composites of these materials. In the electrochemical deposition chamber the barrier layer is clamped and then electrochemically etched at FIG. 9b to smooth the barrier layer. A copper layer 940 is then formed over the barrier layer 910 to fill the trench 930 to form a copper interconnect line. The seed layer 940 will conform to the smooth barrier layer so that it too will be smooth so that there is a smooth surface within the trench as illustrated at FIG. 9c.

In an alternate embodiment the roughness of the interconnect line is reduced by smoothing thin copper films. This embodiment is illustrated in FIGS. 10a-10f. A dielectric layer 1010 having a trench 1020, a thin barrier layer 1030 of between 2-10 mm, and a thick copper seed layer 1040 of between 20-40 nm is illustrated at FIG. 10a. A copper film 1050 is electrochemically deposited over the trench at FIG.

10b. The copper film is then electrochemically etched at FIG. 10c to smooth the surface. A second copper film 1060 is then electrochemically deposited over the first copper film at FIG. 10d. The second copper film is electrochemically etched at FIG. 10e to further smooth the surface of the trench before the trench is filled with copper layer 1070 to form the interconnect line. Providing a smooth copper surface on which the interconnect is formed will improve nucleation of the copper layer 1070 and therefore form a smoother grain boundary between the second copper film 1060 and the copper layer 1070 as illustrated in FIG. 10f. In an alternate embodiment the deposition and etch sequence of a thin copper film can be repeated several times to make the surface as smooth as possible. In another embodiment, there is no copper seed layer and the barrier layer is thick (greater than 20 nm) so that the electrodes can be attached to the barrier layer.

The above embodiments describing the deposition and subsequent etching of a seed layer, a barrier layer, and a copper film may be done in combination with one another. This would be possible because of the relative ease of simply reversing the polarity of the electrode coupled to the wafer in order to electrochemically etch after the deposition of a layer. In one embodiment, a barrier layer can be electrochemically deposited and etched over a gap in the surface of a substrate, such as a trench in a dielectric layer. A seed layer can then be electrochemically deposited and etched over the gap in the surface of the substrate. Next, a copper film can be deposited and etched over the gap in the surface of the substrate. By using these methods in combination it is possible to make the surface on which the copper interconnect line is formed very smooth, and thus reduce the line roughness significantly.

CONCLUSION

Embodiments of the present invention provide methods to reduce the copper line roughness for increased electrical conductivity in narrow interconnects having a width of less than 100 nm. These methods reduce the copper line roughness by smoothing the surface on which the copper lines are formed. This is done by performing a short electrochemical etch of the layer over which the copper line is formed. In a preferred embodiment of the present invention the seed layer for copper is electrochemically etched to form a smooth surface. In an alternate embodiment the barrier layer is etched. In yet another embodiment, thin copper films are deposited and etched repeatedly until a smooth surface is formed. The resistivity of copper interconnect lines is reduced because copper line roughness that exacerbates surface scattering in lines having a width less than 100 m is reduced. The conductivity of the copper lines will thus be increased to improve the performance of the entire interconnect device.

Other modifications from the specifically described devices, solutions, and processes will be apparent to those skilled in the art and having the benefit of this disclosure. Accordingly, it is intended that all such modifications and alterations be considered as within the spirit and scope of the invention as defined by the subjoined claims.

What is claimed is:

1. A method of forming an interconnect comprising:
    forming a dielectric layer patterned to have at least one trench;
    forming a first conductive layer over the dielectric layer, the first conductive layer a barrier layer selected from the group consisting of Ta, TaN, TaSiN, W, WN, WSiN, Ti, TiN, and TiSiN;
    coupling an electrode to the first conductive layer to control the electrical charge of the first conductive layer;
    charging the first conductive layer with the electrode to have a first electrical charge to electrochemically etch the first conductive layer; and,
    reversing the polarity of the electrode to charge the first conductive layer to a second electrical charge to deposit a second conductive layer.

2. The method of claim 1 further comprising polishing the second conductive layer by chemical mechanical polishing.

3. The method of claim 1 wherein the barrier layer has a thickness of greater than 20 nm.

4. The method of claim 1 wherein the dielectric layer has a low dielectric constant of less than around 3.2.

5. The method of claim 1 wherein the dielectric layer is carbon doped oxide.

6. The method of claim 1 wherein the first electrical charge is positive.

7. The method of claim 1 wherein the second electrical charge is negative.

* * * * *

UNITED STATES PATENT AND TRADEMARK OFFICE
CERTIFICATE OF CORRECTION

| | | |
|---|---|---|
| PATENT NO. | : 7,268,075 B2 | Page 1 of 1 |
| APPLICATION NO. | : 10/439975 | |
| DATED | : September 11, 2007 | |
| INVENTOR(S) | : Gracias et al. | |

It is certified that error appears in the above-identified patent and that said Letters Patent is hereby corrected as shown below:

In column 6, at line 48, delete "mm" and insert --nm--.

In column 6, at line 65, delete "mm" and insert --nm--.

In column 8, at line 5, delete "m" and insert --nm--.

Signed and Sealed this

Thirteenth Day of May, 2008

JON W. DUDAS
*Director of the United States Patent and Trademark Office*